(12) United States Patent
En et al.

(10) Patent No.: US 6,518,631 B1
(45) Date of Patent: *Feb. 11, 2003

(54) MULTI-THICKNESS SILICIDE DEVICE FORMED BY SUCCESIVE SPACERS

(75) Inventors: William G. En, Milpitas, CA (US); Srinath Krishnan, Campbell, CA (US); Dong-Hyuk Ju, Cupertino, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/824,418

(22) Filed: Apr. 2, 2001

(51) Int. Cl.$^7$ ............................................. H01L 31/113
(52) U.S. Cl. ................... 257/382; 257/334; 257/410; 257/411
(58) Field of Search ...................... 257/382, 410–412, 257/295, 298, 314–326, 900; 438/300–305, 570, 201, 211, 216, 257, 258, 260–265, 241, 421, 591–595, 954, 981

(56) References Cited

U.S. PATENT DOCUMENTS 6,018,180 A * 1/2000 Cheek et al. ............... 257/344
6,127,711 A * 11/2000 Ono ............................ 257/410
6,242,776 B1 6/2001 Hause et al. ................ 257/344
2002/0008295 A1 * 1/2002 Yang et al. ................. 257/413
2002/0019096 A1 * 2/2002 Choi et al. ................. 438/244

OTHER PUBLICATIONS

Jean–Pierre Colinge, "Silicon–On–Insulator Technology: Materials to VLSI", 2$^{nd}$ Edition, pp. 3–4 and 114–116, 1997, Kluwer Academic Publishers, USA.

* cited by examiner

Primary Examiner—David Nelms
Assistant Examiner—Long K. Tran
(74) Attorney, Agent, or Firm—Renner, Otto, Boisselle & Sklar, LLP

(57) ABSTRACT

A transistor device formed on a semiconductor-on-insulator (SOI) substrate with a buried oxide (BOX) layer disposed thereon and an active layer disposed on the BOX layer having active regions defined by isolation trenches. The device includes a gate defining a channel interposed between a source and a drain formed within the active region of the SOI substrate. Further, the device includes a plurality of thin silicide layers formed on the source and the drain. Additionally, at least an upper silicide layer of the plurality of thin silicide layers extends beyond a lower silicide layer. Further still, the device includes a plurality of spacers used in the formation of the device. The device further includes a second plurality of thin silicide layers formed on a polysilicon electrode of the gate.

15 Claims, 8 Drawing Sheets

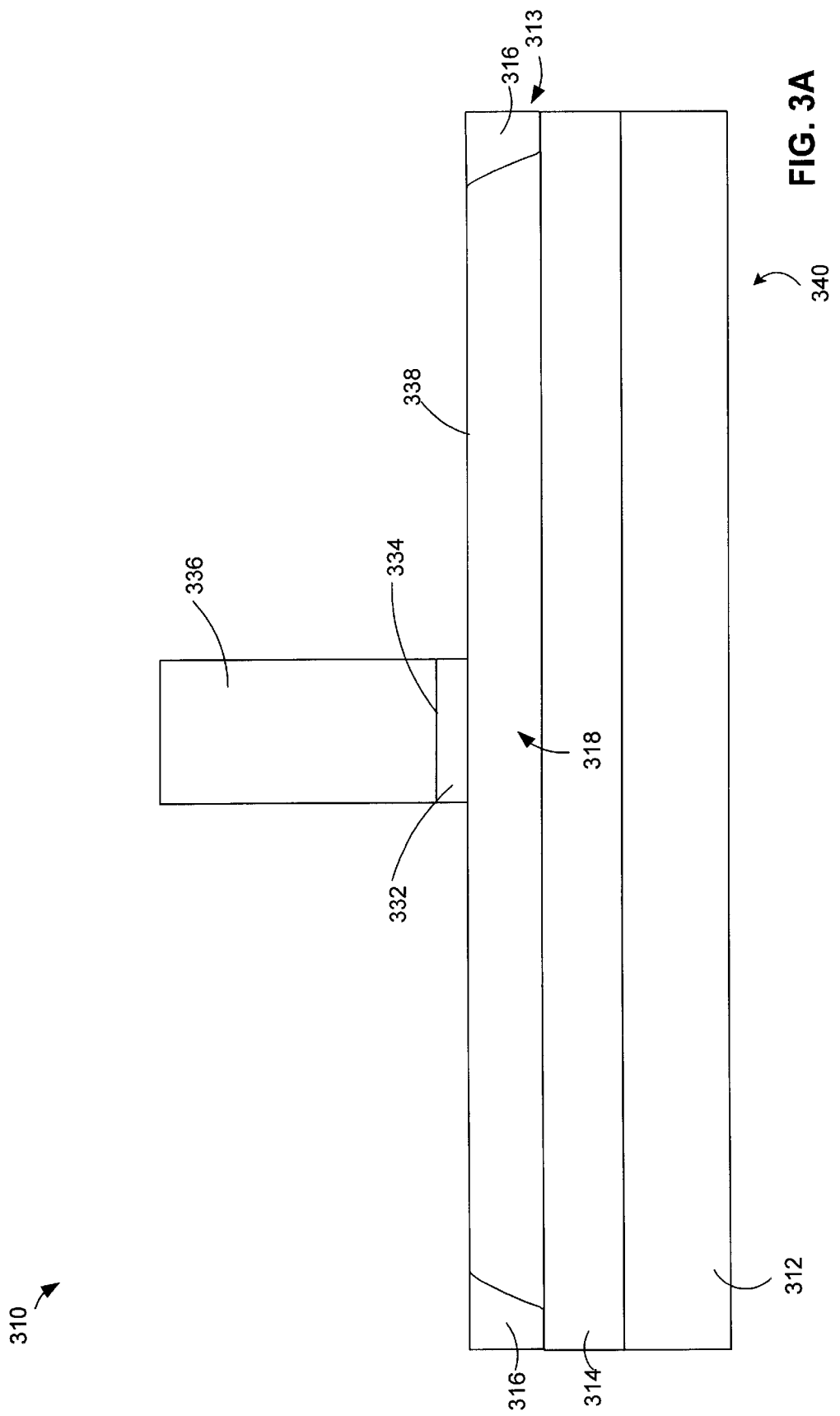

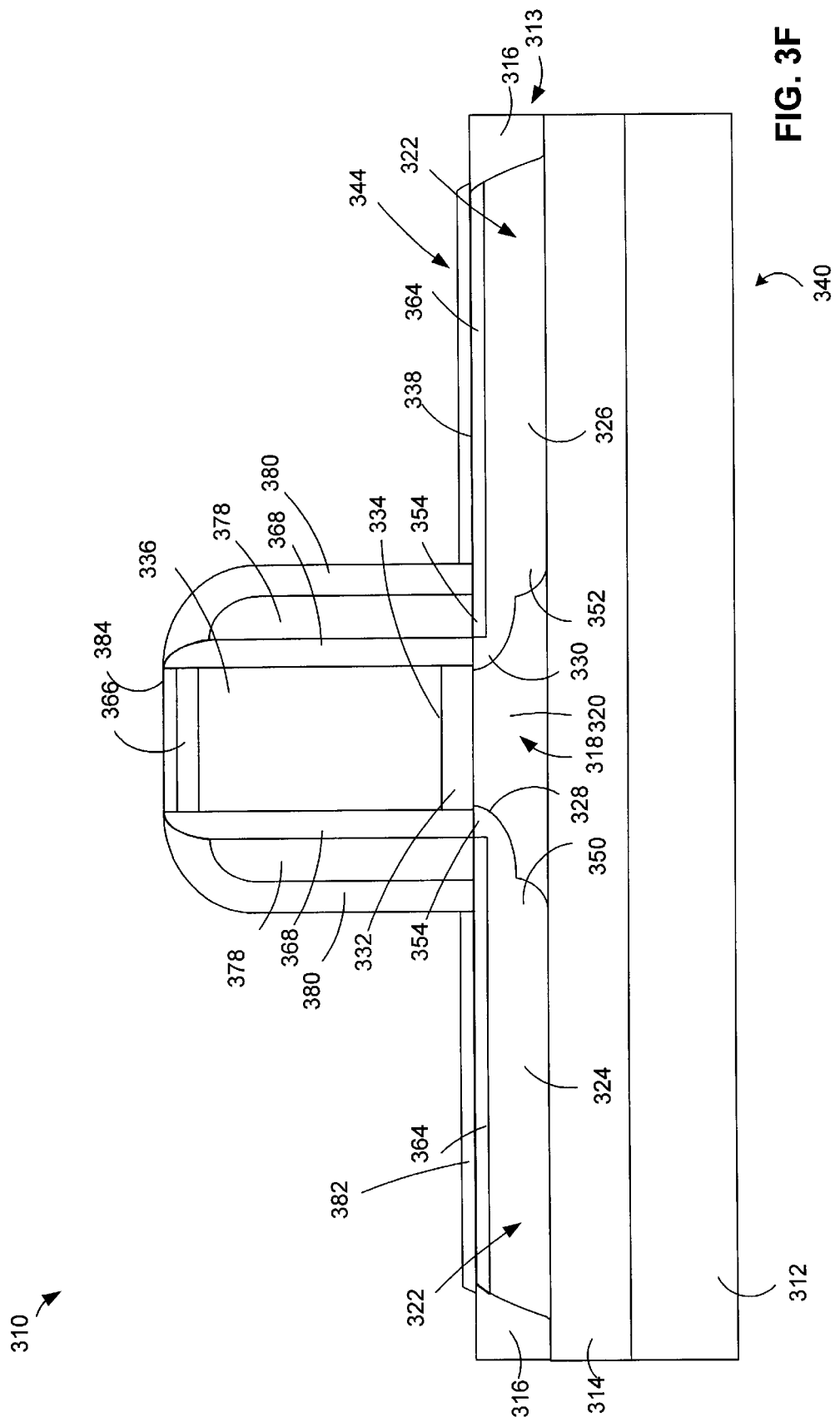

MULTI-THICKNESS SILICIDE DEVICE FORMED BY SUCCESIVE SPACERS

TECHNICAL FIELD

The present invention generally relates to the manufacture of semiconductor devices and, more specifically, relates to the manufacture of devices including multi-thickness silicide, multi-layered silicide and multi-thickness multi-layered silicide.

BACKGROUND ART

Integrated electrical circuit devices such as electrically erasable programmable read only memories (EEPROMs), transistors, diodes, thyristers and the like are usually manufactured on a semiconductor substrate, such as silicon. Such semiconductor substrates, even when doped, are usually more resistive than most metal-containing materials. Resistive contacts and interconnects are not desirable for electrical circuits due to the fact that resistance limits maximum current flow, may create heat, and may result in reduced circuit accuracy, consistency, and performance. Therefore, devices such as metal oxide semiconductor (MOS) transistors typically use a silicide or salicide layer over the source, drain and gate regions in order to reduce contact resistance. However, such transistors with silicide or salicide layers still tend to suffer from high contact resistance.

Transistors made on silicon-on-insulator (SOI) structures suffer from what is referred to as floating body effect (FBE) in addition to the above disadvantages. The FBE is when a body region voltage varies undesirably because the body region is electrically isolated from the substrate. The FBE introduces several undesirable characteristics. FBE causes, for example, sharp increases in the relationship between drain current and drain voltage ("kink effect"), anomalous subthreshold current, transient current overshoot, and early device voltage $VD_S$ breakdown. The kink effect may lead to lower device gain, which is undesirable in analog applications. The FBE remains a major obstacle to acceptable operation of SOI MOSFET transistors.

U.S. Pat. No. 5,352,631 addresses the above discussed disadvantages relating to contact resistance. In particular, U.S. Pat. No. 5,352,631 describes a method of forming one suicide species overlying the gate region, and another silicide species overlying the source and drain regions. However, there is no suggestion as to how to overcome the resistance associated with lightly doped drain and source regions (also referred to herein as source and drain extension regions). Further, there is no suggestion as to how to overcome the disadvantages due to the FBE.

In U.S. Pat. No. 5,965,917, one suggestion to overcome some of the disadvantages due to the FBE is to include a metal connector (electrical contact) that directly contacts a top silicide region, a side of a first doped region and a side of a body region. The disclosed device overcomes some of the disadvantages due to the FBE. For example, a voltage applied to the electrical contact sets the voltage of the body region because the electrical contact is directly coupled to the body region. However, there is no suggestion as to how to overcome the resistance in the lightly doped drain and source extension regions.

Therefore, there exists a need in the art for an electrical device which tailors resistance in the various regions such as the polysilicon regions of the source and drain regions, the junction regions of the source and drain regions, and the source and the drain extension regions. Further, there is a need in the art for an electrical device which, in addition to providing tailored resistance, also reduces the disadvantages due to the FBE associated with such devices on SOI structures.

SUMMARY OF THE INVENTION

According to one aspect of the invention, the invention is a transistor device formed on a semiconductor substrate having active regions defined by isolation trenches. The device includes a gate defining a channel interposed between a source and a drain formed within the active region of the semiconductor substrate. Further, the device includes a plurality of thin silicide layers formed on the source and the drain. Additionally, at least an upper silicide layer of the plurality of thin silicide layers extends beyond a lower silicide layer. The device also includes a plurality of spacers used in the formation of the device.

According to another aspect of the invention, the plurality of spacers is permanent spacers formed in successive steps during a formation process of the device.

According to another aspect of the invention, the multi-thickness silicide layer includes at least two layers of silicide of different species.

According to another aspect of the invention, the semiconductor substrate is a semiconductor-on-insulator (SOI) substrate with a buried oxide (BOX) layer interposed between the active layer and a main semiconductor substrate and wherein the BOX layer further defines the active regions.

According to another aspect of the invention, the semiconductor substrate is on a germanium-on-insulator (GOI) substrate.

According to another aspect of the invention, the invention is a method of fabricating a transistor device formed on a semiconductor substrate having active regions defined by isolation trenches. The method includes the step of forming a gate defining a channel interposed between a source and a drain formed within the active region of the semiconductor substrate. Further, the method includes forming a plurality of thin silicide layers on the source and the drain. Further, the method includes the step of forming a first plurality of spacers.on the gate side walls. In addition, the method includes the step of forming a second plurality of spacers on the first plurality of spacers. Additionally, at least an upper silicide layer of the plurality of thin silicide layers extends beyond a lower silicide layer.

According to another aspect of the method, the semiconductor substrate is a semiconductor-on-insulator (SOI) substrate with a buried oxide (BOX) layer interposed between the active layer and a main semiconductor substrate and wherein the active regions are further defined by the BOX layer.

BRIEF DESCRIPTION OF DRAWINGS

These and further features of the present invention will be apparent with reference to the following description and drawings, wherein:

FIGS. 3A–3F are cross-section views of the SOI transistor device including multi-thickness silicide layers according to the present invention at intermediate stages of manufacture.

DISCLOSURE OF INVENTION

Figure 1:
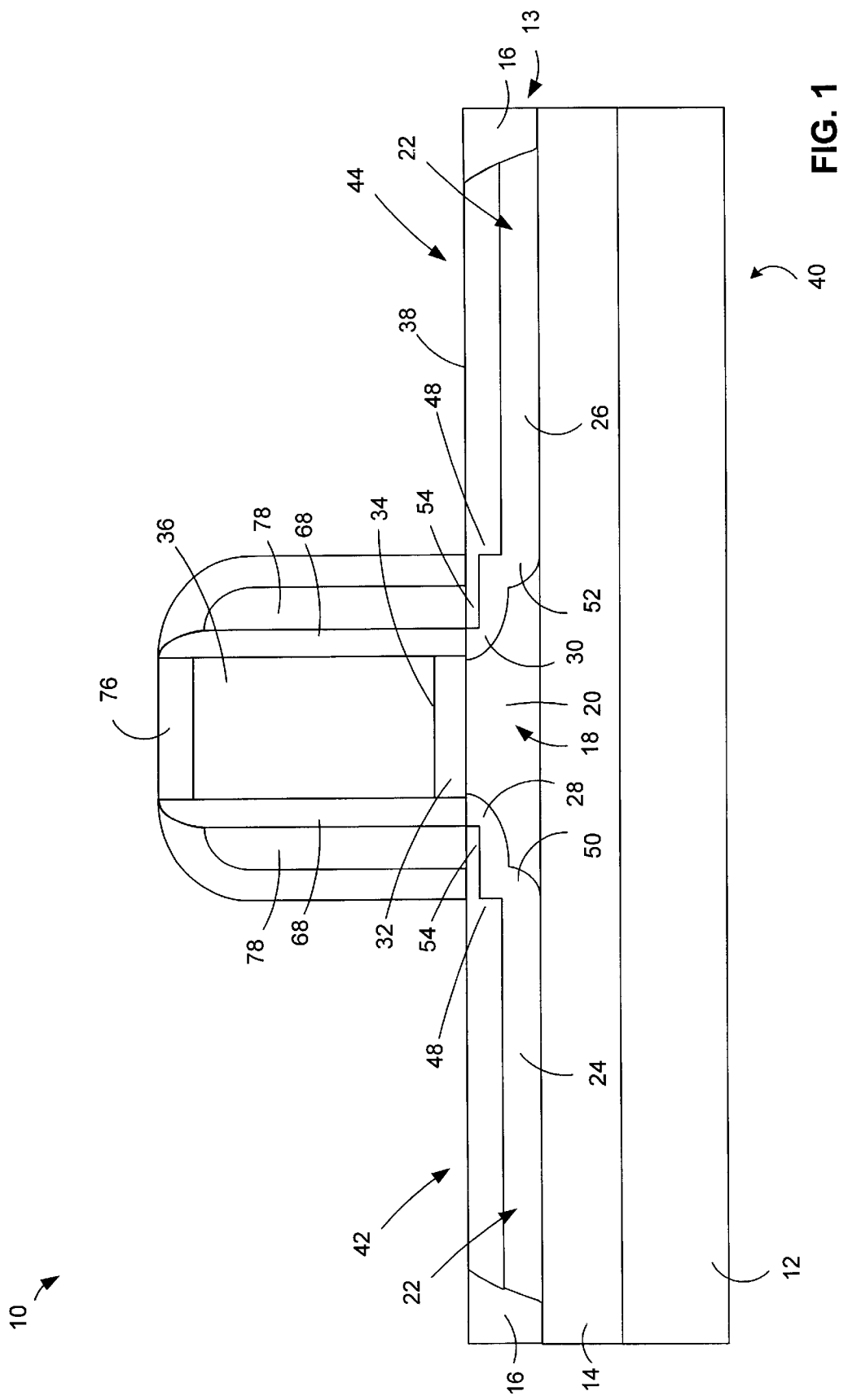
FIG. 1 is a cross-section of an SOI transistor device including multi-thickness suicide layers according to the present invention.

In the detailed description that follows, identical components have been given the same reference numerals. To illustrate the present invention in a clear and concise manner, the drawings may not necessarily be to scale and certain features may be shown in a partial schematic format.

An SOI transistor device including multi-thickness silicide layers and successive spacers will now be described in accordance with the present invention. The device includes a gate defining a channel interposed between a source and a drain and is disposed within one of the active regions of an SOI structure. Further, the device includes a multi-thickness silicide layer formed on the main source and drain regions and the source and drain extension regions as will be described in more detail below. Further still, the device also includes a plurality of spacers used in the formation of the device wherein a first spacer is formed on the gate side wall. A second spacer is formed on the first spacer. Optionally, a third spacer or more may be formed on the preceding spacer. Additionally, a portion of the multi-thickness silicide layer which is formed on the source and drain extension regions is thinner than a portion of the multi-thickness silicide layer which is formed on the main source and drain regions. The device may include a further silicide layer formed on a polysilicon electrode of the gate. Further still, the multi-thickness silicide layers may include at least two layers of silicide of two different species.

The SOI transistor device including multi-thickness silicide layers results in an SOI transistor device with significantly reduced contact resistance in the main source/drain regions compared with conventional transistor devices. Additionally, the SOI transistor device including multi-thickness silicide layers and a silicide layer on the polysilicon gate electrode helps reduce AC effects. Further, the very thin silicide layer formed on the source/drain extension regions helps to reduce the FBF within the S0I structure.

Referring initially to FIG. 1, an SOI transistor device of the present invention is shown generally designated as 10. The SOI transistor device 10 is formed within a semiconductor-on-insulator (SOI) structure having a semiconductor substrate 12, a buried oxide (BOX) layer 14 formed on the semiconductor substrate 12, and a semiconductor layer 13 disposed on the BOX layer 14. Within the semiconductor layer 13, shallow trench isolation (STI) regions 16 along with the BOX region 14 define the semiconductor active regions 18 of which one is shown in FIG. 1.

In an exemplary embodiment, as illustrated in FIG. 1, the active region 18 is a p-type region, or channel 20, and two N+ (source and drain) regions 22. The channel 20 is interposed between the source and drain regions 22. Alternatively, an n-type channel could be interposed between two P+ regions as will be readily appreciated. The source and drain regions 22 include respective deep implant regions 24 and 26, as well as respective extension regions 28 and 30. A gate dielectric 32 is interposed between a lower surface 34 of a gate electrode 36 and an upper surface 38 of the SOI semiconductor substrate 40. The gate dielectric 32 illustrated in FIG. 1 is a single layer dielectric, however the gate dielectric could be a multi-layer dielectric.

Multi-thickness silicide layers 42, 44 are disposed on a portion of the source and drain regions 22. Silicide regions 48 are formed on the polysilicon regions of the respective deep implant regions 24 and 26 and the respective deep implant junction regions 50 and 52. Very thin silicide regions 54 are formed over the respective extension regions 28 and 30. The multi-thickness silicide layers 42, 44 may be made of typical, well-known silicides, such as cobalt silicide ($CoSi_2$), titanium silicide ($TiSi_2$), tantalum silicide ($TaSi_2$), nickel suicide ($NiSi_2$) or the like. In an exemplary embodiment, the multi-thickness suicide layers 42, 44 are of $CoSi_2$. Silicide regions 48 could have a thickness of between 50 Å and 250 Å. Very thin silicide regions 54 could have a thickness of between 25 Å and 100 Å.

On top of the gate electrode 36 is a silicide layer 76. The silicide layer 76 may be made of the same suitable silicide materials described above. The silicide layer 76 may be made of the same material as the silicide layers 42, 44 or may be made of another silicide material described above. An exemplary silicide layer 76 may have a thickness of between 100 Å and 200 Å.

Spacer 68 extends upward from the upper surface 38 of the SOI substrate 40 encompassing the gate dielectric 32 and gate electrode 36. Spacer 78 extends upward from the upper surface 38 of the SOI substrate 40 encompassing spacer 68. The spacers 68 and 78 are permanent spacers used in the formation of the multi-thickness layers 42, 44, as well as the source and drain regions 22 which will further be described below.

It will be appreciated that the active region 18, the channel 20, the source and drain regions 22, the gate dielectric 32, the gate electrode 36, the silicide layer 76, the multi-thickness silicide layers 42, 44, and the successive spacers together form the SOI transistor device of the present invention. The principles of operation of an SOI transistor having multi-thickness silicide layers over the source and the drain regions of the gate device will be further explained below. It will be appreciated that the SOI transistor device 10 may alternatively have other shapes than the shape shown in FIG. 1.

Figure 2:
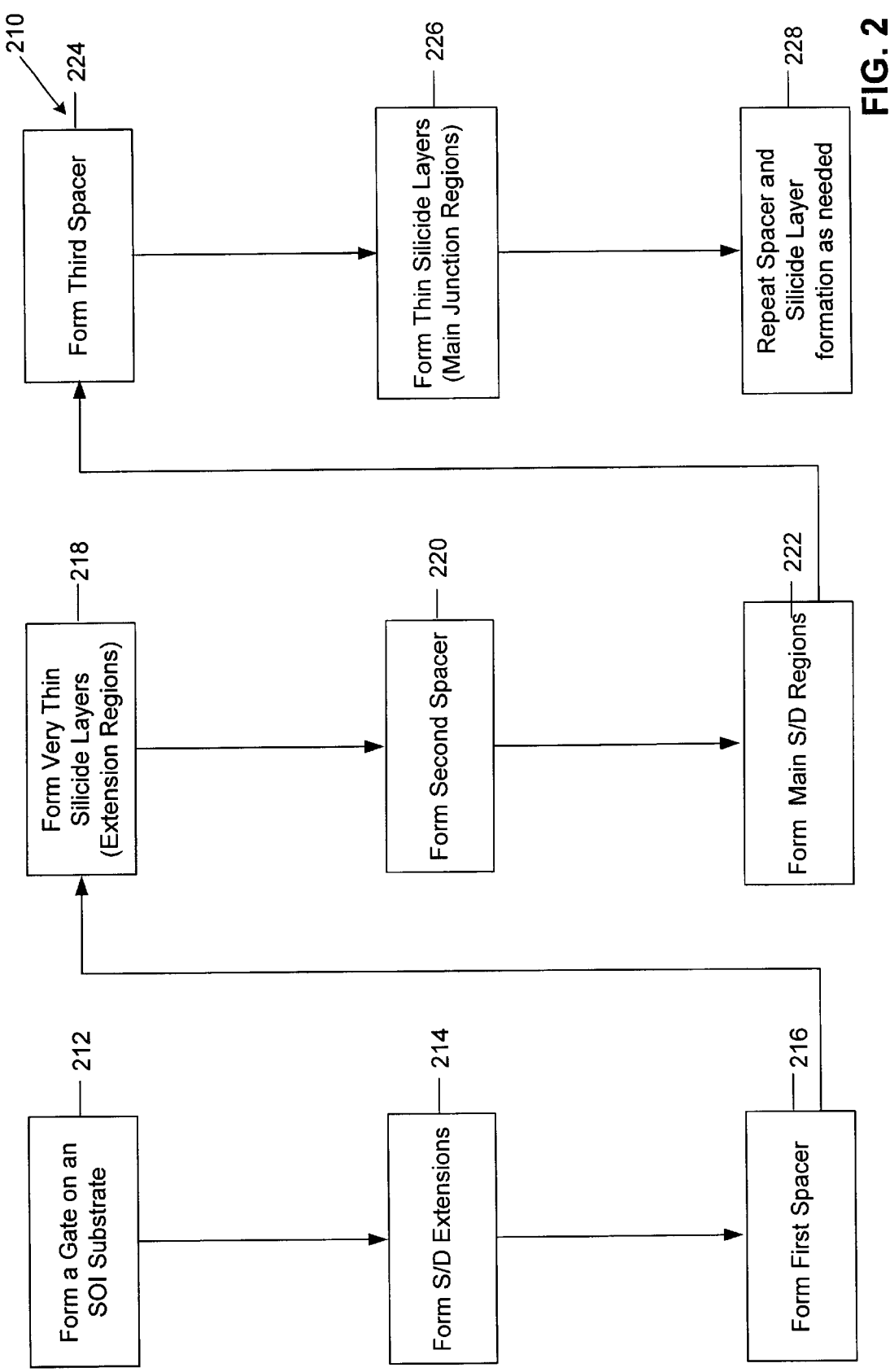
FIG. 2 is a flow diagram of a method of manufacturing the SOI transistor device including multi-thickness silicide layers according to the present invention.

The steps of a method 210 for fabricating a semiconductor device 310 (which may be similar to the semiconductor device 10 described above) are outlined in the flow chart shown in FIG. 2. FIGS. 3A–3F illustrate various steps of the method 210. It will be appreciated that the method 210 and the semiconductor device 310 described below are merely exemplary, and that suitable embodiments of the many above-described variations in materials, thicknesses, and/or structures may alternatively be used in the method 210 and/or the semiconductor device 310.

In step 212, a conventional polysilicon gate is formed on an SOI substrate as an intermediate stage of manufacture for the SOI transistor device 310. As shown in FIG. 3A, the SOI transistor device 310 includes a semiconductor substrate 312, a BOX layer 314 formed on the semiconductor substrate 312 and a semiconductor layer 313 disposed on the BOX layer 314. An exemplary BOX layer may have a thickness of between 1800 Å and 2200 Å. Whereas, an exemplary semiconductor layer 313 disposed on the BOX layer 314 may have a thickness of between 800 Å and 1000 Å. Suitable semiconductor materials such as silicon, carbide, germanium or the like may be used as the semiconductor layer 313 disposed on the BOX layer 314. Within the semiconductor layer 313 disposed on the BOX layer 314, are shallow trench isolation (STI) regions 316 which along with the BOX layer 314 define the location of a semiconductor active region 318 for a future step. The STI regions 316 are insulator-filled to electrically isolate individual electrical devices such as the SOI transistor device 310. Other isolation techniques that are known in the art may be used to isolate the SOI transistor device 310.

A gate dielectric 332 is interposed between the lower surface 334 of a gate electrode 336 and an upper surface 338 of a portion of the SOI semiconductor substrate 340. The gate dielectric 332 illustrated in FIG. 3A is a single-layer dielectric, however the gate dielectric could be a multi-layer dielectric as described above. The gate dielectric 332 may be made of suitable gate dielectric materials, such as silicon dioxide ($SiO_2$), silicon nitride ($Si_3N_4$), aluminum oxide ($Al_2O_3$), hafnium oxide ($HfO_2$), silicon oxynitride (SiNO) or the like. In this embodiment, dielectric layer 332 is made of $Si_3N_4$. The exemplary dielectric layer 332 of $Si_3N_4$ may have a thickness of between 13 Å and 16 Å. The gate electrode 336 may be made of typical, well-known conductive materials, for example polysilicon. An exemplary gate electrode 336 may have a thickness of between 800 Å and 1200 Å.

A more detailed description of an implantation process which will create the source and drain regions 322 which may be performed after the gate formation, is described below. In this exemplary embodiment, the channel region 320 underneath the gate dielectric 332, interposed between the source and the drain regions 322 is p-type doped prior to this step by either alternative described above.

In step 214, the source and drain extension regions 328, 330 are formed. Prior to the source and drain extension formation, the semiconductor layer 313 of semiconductor substrate 340 may be appropriately doped to form a region or layer of electrically-active material for eventual use as an active region of the SOI transistor device 310 to be formed. For instance, boron or indium may be implanted to form a p-type region or channel for an n-type device and phosphorous or arsenic may be implanted to form an n-type region or channel for a p-type device. It should be understood that the semiconductor layer 313 could be appropriately doped prior to gate formation.

After formation of the gate, the lightly doped source and drain extension regions 328, 330 may be formed using techniques well known in the art for forming such extension layers. An extension perpendicular implant is a relatively low energy, low concentration implant which is capable of producing the source and drain extensions 328 and 330. The total concentration of the extension implants may be, for example, between $1 \times 10^{18}$ atoms/$cm^3$ and $1 \times 10^{18}$ atoms/$cm^3$. An exemplary range of implant dose for the perpendicular implant is between $1 \times 10^{15}$ and $2 \times 10^{15}$ atoms/$cm^2$. The extension perpendicular implants may be of the same material as the main perpendicular implant, or may alternatively include different materials. It should also be appreciated that the extension implants may be different from one another, if so desired.

Next in step 216, a permanent spacer 368 may be formed around the gate to protect the gate electrode 336 and future extension regions 328, 330 from dopants used in the formation of the main source and the drain regions 326, 328 in a later step. In order to form the permanent space, a spacer material such as an oxide material, for example silicon dioxide ($SiO_2$), silicon nitride ($Si_3N_4$) or the like, is then deposited on the substrate 340 (not shown). The deposition produces an oxide layer upon a top surface 338 of the SOI substrate 340. The oxide deposition may be performed, for example, by plasma enhanced chemical vapor deposition (PECVD).

The oxide is etched with a suitable etchant. The substrate oxide layers are reduced in size, leaving oxide spacers similar to spacers 368 shown in FIG. 3C. The oxide spacer may extend from a surface 338 of the semiconductor substrate 340 to a height of between 3000 Å and 4000 Å.

Thereafter, in step 218, a metal layer 360 is formed overlying the source and drain extension layers 328, 330.

Figure 3B:
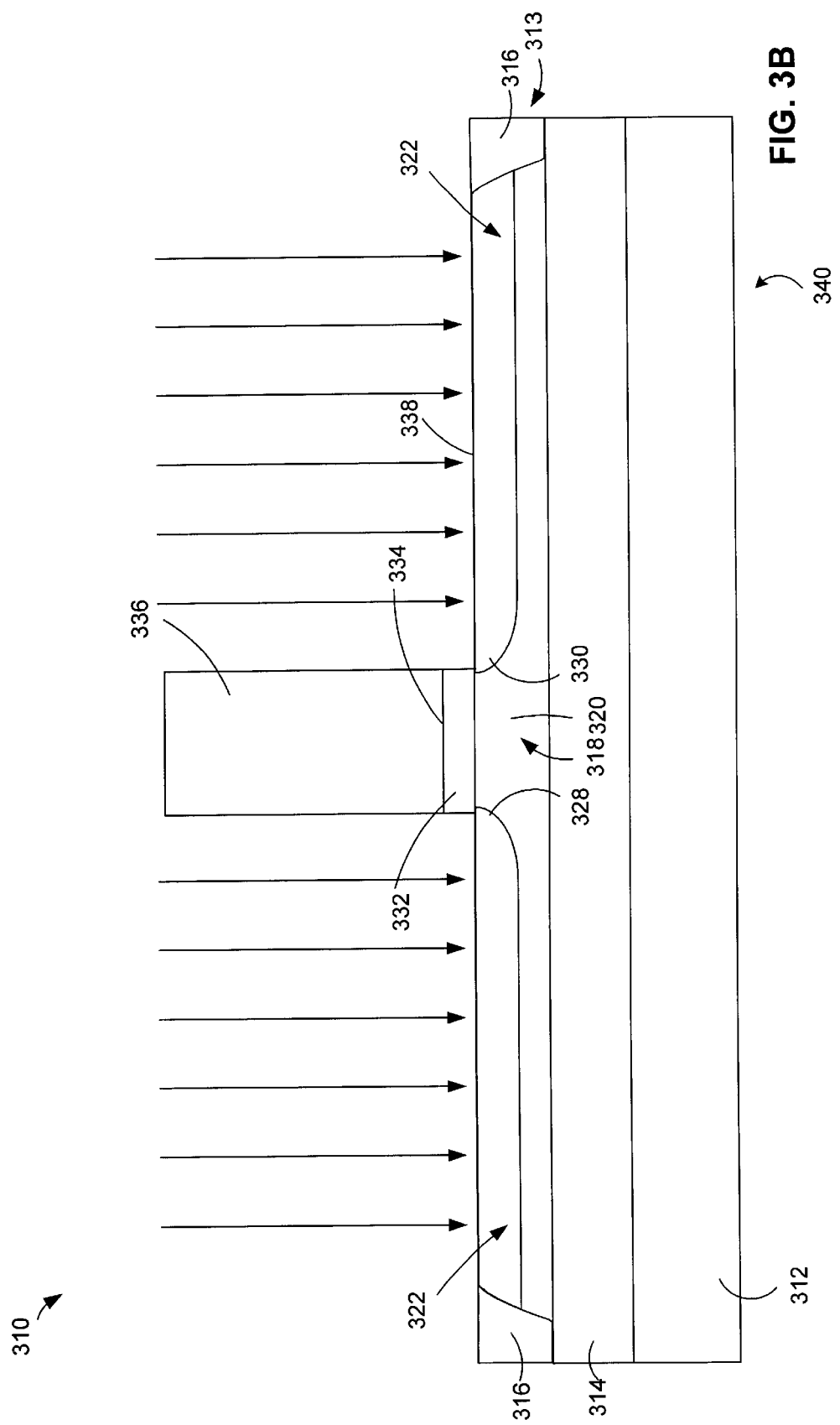
Figure 3C:
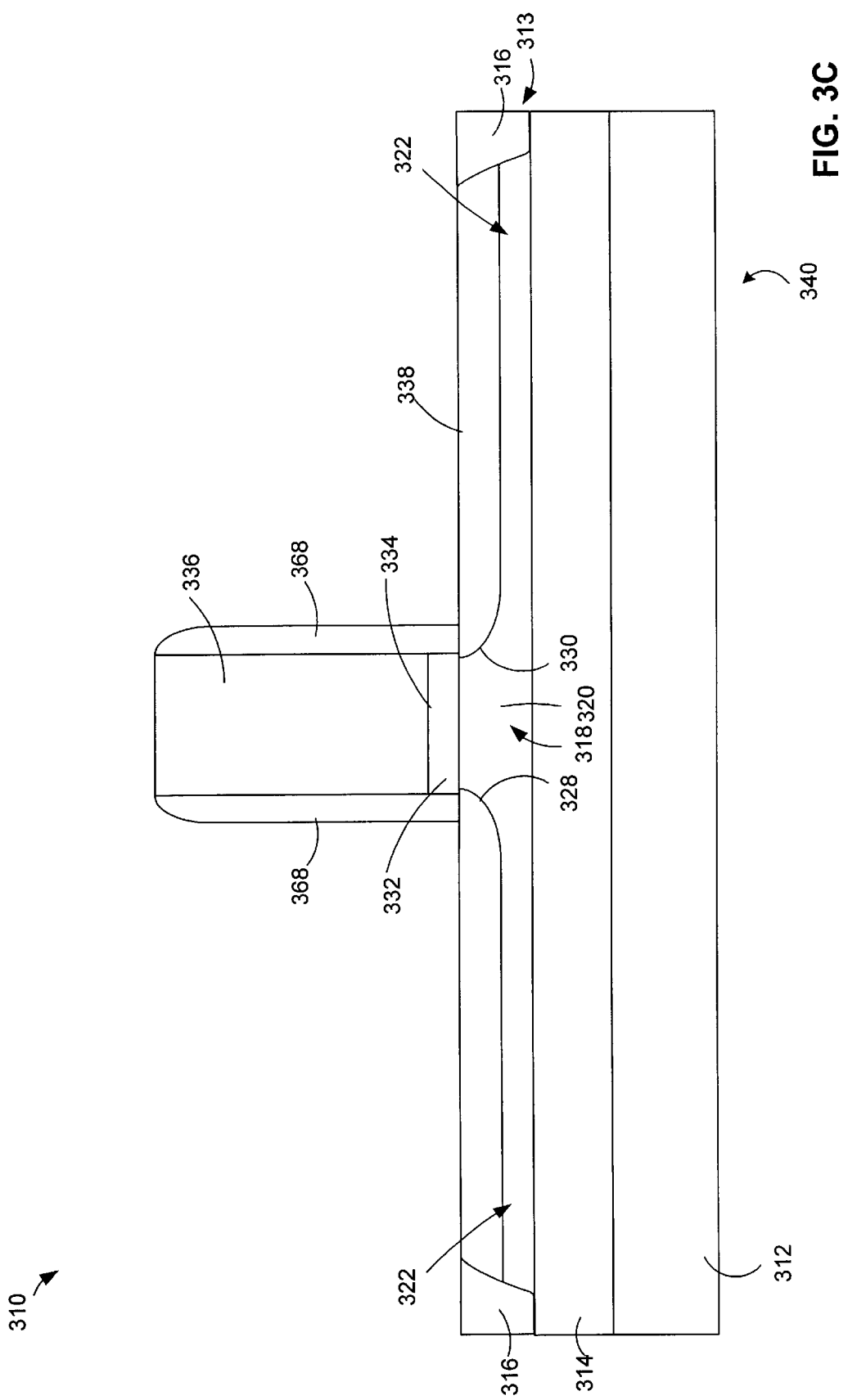
Figure 3D:
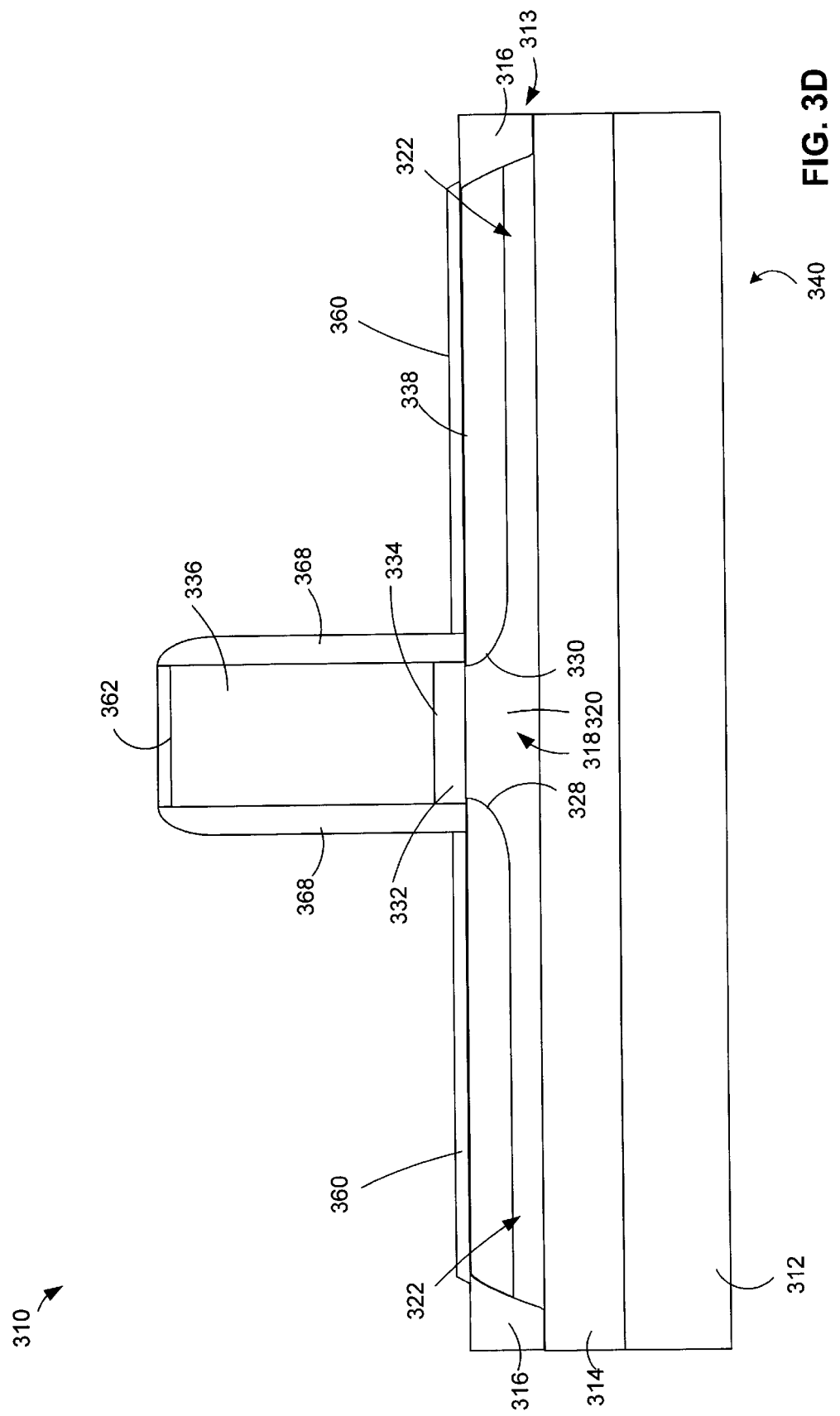

The metal layer 360 is formed by one of either sputtering, chemical vapor deposition (CVD), or evaporation. The metal layer 360 may comprise any metal such as platinum, titanium, tantalum, nickel, cobalt, tungsten, and/or the like. In an exemplary embodiment, cobalt is used to form metal layer 360. Cobalt is preferred due to the fact that cobalt suicides have dopant diffusion and segregation coefficients that allow for formation of shallow conformal source and drain junctions, as illustrated in FIG. 3D. After deposition of the metal layer 360, a heating cycle is performed. The heating cycle is used to react the portions of metal layer 360 which overlie the source extension 328 and the drain extension 330. If the metal layer 360 comprises cobalt and the semiconductor layer 313 is silicon, then the cobalt reacts with the silicon within interface regions to form cobalt silicide ($CoSi_2$). Typical heat cycle temperatures for silicide/salicide formation range from 200° C. to 700° C. depending on the type of metal used. In all cases, silicided regions 364, shown in FIG. 3E, (also referred to as salicided regions in self-aligned cases) are formed within the source and drain regions 322 via the heating cycle. All unreacted portions of the metal layer 360 are removed via known etch techniques without removing the silicided regions 364. For example, cobalt may be etched using an HCl and water isotropic etch chemistry.

Figure 3E:
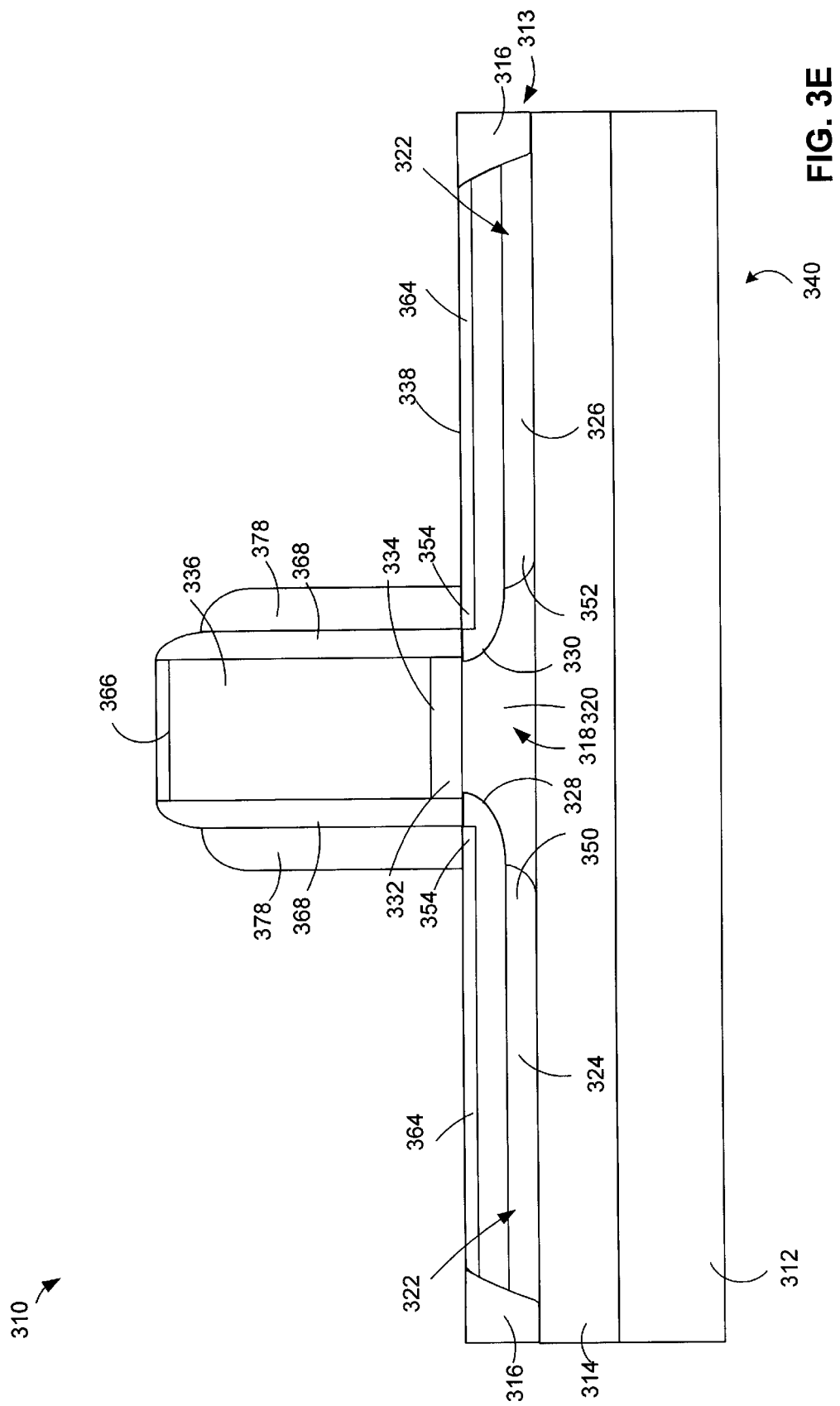

It should be understood that at this time a metal layer 362 of the same or a different metal could be formed overlying the gate electrode 336 and processed as described above in a self-aligning process to produce a silicide layer 366 (shown in FIG. 3E).

Next in step 220, a permanent spacer 378 may be formed around the spacer 368 to protect the very thin silicide layer 354 and future extension regions 328, 330 from dopants used in the formation of the main source and the drain regions 326, 328 in a later step. The spacer is formed using a technique described above or other techniques known in the art.

Now in step 222, the main source and drain regions may be formed by a main perpendicular implant, which will not affect the extension implant regions due to the spacers 368, 378 acting as masks. The main perpendicular implant is a relatively high energy, high concentration implant which is capable of producing the source and drain deep implant regions 324 and 326. An exemplary range of concentration of these dopants is between $1 \times 10^{18}$ and $1 \times 10^{18}$ atoms/$cm^3$. An exemplary range of implant dose for the perpendicular implant is between $1 \times 10^{15}$ and $2 \times 10^{15}$ atoms/$cm^2$. The main perpendicular implants may be of the same material or may alternatively include different materials.

It will be appreciated that many alternative sequences or steps may be used to accomplish the implantation. Additionally, although the extension implantation and the main implantation are illustrated as each involving one implant, it will be appreciated that a greater number of implants may be employed. Further, halo implants may be used in forming the extension implantation after gate 336 patterning or/and spacer 368, 378 formation. For example, tilt angle extension implants (35–45 degrees) implanting In or $BF_2$ utilizing four rotations for a total implantation dose between $3.5 \times 10^{13}$ and $5 \times 10^{13}$ atoms/$cm^2$ with energies 30–80 keV. Thus, the source and drain regions 322 are formed.

After implantation, the semiconductor device 310 may be subjected to rapid thermal annealing (RTA) at this time or at a later time. Exemplary RTA may be performed for between five and fifteen seconds at a temperature of 1,020–1,050° C.

A third spacer 380 is formed in step 224 in a manner described above. The spacer 380 is formed over the spacer 378 and any exposed portion of spacer 368. It should be understood that spacer 380 may be formed only over 30 spacer 378 provided that spacer 378 completely covers 368.

Next in step 226, a metal layer 382 is deposited and heated as described above to form a multi-thickness silicide layer 372 of $CoSi_2$ (shown in FIG. 3F) over the main source and drain junction regions 350, 352 as well as the main source region 324 and the main drain region 326. The spacer 368 covering the portion of the silicide layer region 364 prevents the deposition of the metal layer 366 over the very thin portions of the silicide layers 364 overlying the source extension 328 and the drain extension 330 forming very thin silicide layer 354.

It should be understood that a different metal could be formed overlying the silicide layer 364 and processed as described above resulting in a silicide layer having both multi-thickness regions and multi-layers (not shown). Additionally, it should be understood that at this time a metal layer 384 of the same or a different metal could be formed overlying the silicide layer 366 and processed as described above in a self-aligning process to produce a silicide layer 76 (shown in FIG. 1).

Thereafter, in step 228, a fourth or subsequent spacer may be formed to protect a portion of the silicide layers which overlies the main source and drain regions 322. Next, a metal layer may be deposited and heated as described above to form a multi-thickness silicide layer of $CoSi_2$ over the source and drain regions 322. The spacers covering the portions of the preceding silicide layers prevent the deposition of the metal layer over such layers. Thus, a multi-thickness silicide layer may be tailored to the application of the device.

It should be understood that a different metal could be formed overlying the silicide layer 360 and processed as described above resulting in a silicide layer having both multi-thickness regions and multi-layers (not shown). Additionally, it should be understood that at this time a metal layer 382 of the same or a different metal could be formed overlying the silicide layer 364 and processed as described above in a self-aligning process to produce a silicide layer 42, 44 (shown in FIG. 1). Thus, a device 10 having multi-thickness silicide may be produced.

In an alternative exemplary embodiment, the source and drain regions 322 can be formed using the process described below. An ion implant as described above may be used to dope the silicide regions 342, 344 with dopant atoms. Either boron, arsenic, or phosphorus may be used alone or in any combination as the dopant atoms. Therefore, either an n-type channel transistor or a p-type channel transistor may be formed. In one embodiment, the dopant atoms are ion implanted at an energy which places the dopant atoms only in the silicided regions 342, 344. Another heating cycle is used to drive the dopant atoms from the silicided regions 342, 344 into the substrate 313 to form the source and drain region 322. In another embodiment, the ion implant of the dopant atoms may be performed at a high energy to ensure that the dopant atoms penetrate the silicided regions 342, 344 and form the source and the drain region 322. It is important to note that the ion implantation of the silicided regions 344 to form the source and the drain region 322 may be performed at any point in time in the process of FIGS. 3A–3F. A self-aligned process is preferred but is optional.

After implantation, the semiconductor device 310 is subjected to rapid thermal annealing (RTA). Exemplary RTA may be performed for between five and fifteen seconds at a temperature of 1,020–1,050° C.

Although the device 10 is illustrated as a transistor on an SOI structure, other devices such as electrically erasable programmable read only memories (EEPROMs), electrically programmable read only memories (EPROMs), flash EPROMs, thyristers, diodes, thin film transistors (TFTs), and the like may be formed on SOI structures as described above or on other types of substrates such as germanium-on-insulator (GOI). Further, such devices could also be formed on bulk substrates and benefit from the features of the above described invention.

Although particular embodiments of the invention have been described in detail, it is understood that the invention is not limited correspondingly in scope, but includes all changes, modifications and equivalents coming within the spirit and terms of the claims appended hereto.

What is claimed is:

1. A transistor device formed on a semiconductor substrate having active regions defined by isolation trenches, the device comprising:

a gate defining a channel interposed between a source and a drain formed within the active region of the semiconductor substrate wherein the source and the drain include main source and drain regions and source and drain extension regions;

a multi-thickness silicide layer formed on the main source and drain regions and source and drain extension regions wherein a portion of the multi-thickness silicide layer which is formed on the source and drain extension regions is thinner than a portion of the silicide layer which is formed in the main source and drain regions and wherein the multi-thickness silicide layer which is formed on polysilicon regions of the main source and drain regions is thicker than the portion of the silicide layer which is formed on main junction regions of main source and drain regions; and a plurality of spacers used in the formation of the device.

2. The transistor device according to claim 1, wherein the plurality of spacers is permanent spacers formed in successive steps during a formation process of the device.

3. The transistor device according to claim 1, wherein a first spacer is formed on the gate side wall; and a second spacer is formed on the first spacer.

4. The transistor device according to claim 1, wherein a third spacer is formed on the preceding spacer.

5. The transistor device according to claim 1, wherein the multi thickness silicide layer includes at least two layers of silicide of different species.

6. The transistor device according to claim 2, wherein the least two layers of silicide of different species include;

a first suicide layer which is formed on the source and drain regions and extends into the extension regions;

a second silicide layer which is formed on the main source and drain regions.

7. The transistor device according to claim 6, wherein the least two layers of silicide of different species include;

a first silicide layer which is formed on the source and drain regions and extends into the extension regions with a thickness in a range between 25 Å and 100 Å;

a second silicide layer which is formed on the main source and drain regions with a thickness in a range between 50 Å and 250 Å.

8. The transistor device according to claim 1, including a second silicide layer formed on a polysilicon electrode of the gate.

9. The transistor device according to claim 1, wherein the thickness of the portion of the multi-thickness silicide layer which is formed on the source and drain extension regions is in a range between 25 Å and 100 Å.

10. The transistor device according to claim 1, wherein the thickness of the portion of the multi-thickness silicide layer which is formed on the main source and drain regions is in a range between 50 Å and 250 Å.

11. The transistor device according to claim 1, wherein the semiconductor substrate is a semiconductor-on-insulator (SOI) substrate with a buried oxide (BOX) layer interposed between the active layer and a main semiconductor substrate and wherein the active regions are further defined by the BOX layer.

12. The transistor device according to claim 11, wherein the semiconductor-on-insulator substrate is a germanium-on-insulator (GOI) substrate.

13. The transistor device according to claim 11, including a second silicide layer formed on a polysilicon electrode of the gate.

14. The transistor device according to claim 11, wherein the thickness of the portion of the multi-thickness silicide layer which is formed on the source and drain extension regions is in a range between 25 Å and 100 Å.

15. The transistor device according to claim 11, wherein the thickness of the portion of the multi-thickness suicide layer which is formed on the main source and drain regions is in a range between 50 Å and 250 Å.

* * * * *

UNITED STATES PATENT AND TRADEMARK OFFICE
CERTIFICATE OF CORRECTION

PATENT NO. : 6,518,631 B1
DATED : February 11, 2003
INVENTOR(S) : En et al.

It is certified that error appears in the above-identified patent and that said Letters Patent is hereby corrected as shown below:

Title page, Item [54] and Column 1, line 2,
Title, replace "SUCCESIVE" with -- SUCCESSIVE --
Line 37, replace "$VD_S$" with -- $V_{DS}$ --
Line 45, replace "suicide" with -- silicide --

Column 2,
Line 43, replace "spacers.on" with -- spacers on --
Line 60, replace "suicide" with -- silicide --

Column 3,
Line 37, replace "FBF" with -- FBE --

Column 4,
Lines 4 and 5, replace "suicide" with -- silicide --

Column 6,
Line 7, replace "suicide" with -- silicide --

Column 7,
Line 2, replace ".380" with -- 380 --
Line 4, remove "30"

Column 8,
Line 35, replace "in the main" with -- on the main --
Line 56, replace "suicide" with -- silicide --

UNITED STATES PATENT AND TRADEMARK OFFICE
CERTIFICATE OF CORRECTION

PATENT NO.    : 6,518,631 B1
DATED         : February 11, 2003
INVENTOR(S)   : En et al.

It is certified that error appears in the above-identified patent and that said Letters Patent is hereby corrected as shown below:

Column 10,
Line 13, replace "suicide" with -- silicide --

Signed and Sealed this

Twenty-seventh Day of May, 2003

JAMES E. ROGAN
*Director of the United States Patent and Trademark Office*